(12) United States Patent
Khemka et al.

(10) Patent No.: US 10,811,502 B1
(45) Date of Patent: Oct. 20, 2020

(54) METHOD OF MANUFACTURE OF SUPER-JUNCTION POWER SEMICONDUCTOR DEVICE

(71) Applicant: NXP USA, Inc., Austin, TX (US)

(72) Inventors: Vishnu Khemka, Chandler, AZ (US); Tanuj Saxena, Chandler, AZ (US); Ganming Qin, Chandler, AZ (US); Raghuveer Vankayala Gupta, Austin, TX (US); Mark Edward Gibson, Austin, TX (US); Moaniss Zitouni, Gilbert, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/426,924

(22) Filed: May 30, 2019

(51) Int. Cl.
| | | |
|---|---|---|
| H01L 21/00 | (2006.01) |
| H01L 29/00 | (2006.01) |
| H01L 29/40 | (2006.01) |
| H01L 29/66 | (2006.01) |
| H01L 21/308 | (2006.01) |
| H01L 21/28 | (2006.01) |
| H01L 29/423 | (2006.01) |
| H01L 21/02 | (2006.01) |
| H01L 21/311 | (2006.01) |
| H01L 29/49 | (2006.01) |

(52) U.S. Cl.
CPC ...... *H01L 29/407* (2013.01); *H01L 21/02126* (2013.01); *H01L 21/02238* (2013.01); *H01L 21/28211* (2013.01); *H01L 21/308* (2013.01); *H01L 21/31111* (2013.01); *H01L 29/401* (2013.01); *H01L 29/404* (2013.01); *H01L 29/4236* (2013.01); *H01L 29/4916* (2013.01); *H01L 29/66734* (2013.01); *H01L 21/02255* (2013.01)

(58) Field of Classification Search
CPC ......... H01L 21/02126; H01L 21/02238; H01L 21/28211; H01L 21/308; H01L 21/31111; H01L 21/02255; H01L 29/407; H01L 29/401; H01L 29/404; H01L 29/4236; H01L 29/4916; H01L 29/667345
See application file for complete search history.

(56) References Cited

U.S. PATENT DOCUMENTS

| | | |
|---|---|---|
| 7,319,256 B1 | 1/2008 | Kraft et al. |
| 7,385,248 B2 | 6/2008 | Herrick et al. |
| 8,319,278 B1 | 11/2012 | Zeng et al. |
| 10,153,357 B1 | 12/2018 | Qin et al. |

(Continued)

*Primary Examiner* — Nikolay K Yushin
(74) *Attorney, Agent, or Firm* — Charlene R. Jacobsen

(57) ABSTRACT

A method for manufacturing a super-junction MOSFET entails forming a recessed shield electrode in a trench in a semiconductor layer of a substrate, the trench being lined with a first oxide layer. When the electrically conductive material forming the shield electrode is removed to recess the shield electrode, the first oxide layer on sidewalls of the trench is exposed. Removal of the first oxide layer from the sidewalls and from shield sidewalls of the electrode produces openings at a top part of the shield sidewalls. A second oxide layer is formed over the shield electrode and fills the openings. Part of the second oxide layer is removed to expose a top surface of the shield electrode. A gate dielectric is formed over the top surface of the shield electrode and conductive material is deposited over the gate dielectric in the trench to form a gate electrode of the MOSFET.

19 Claims, 10 Drawing Sheets

(56) References Cited

U.S. PATENT DOCUMENTS 10,355,125 B2 * 7/2019 Grivna ................ H01L 29/7813
2015/0069610 A1 * 3/2015 Grivna .............. H01L 29/66348
257/741

* cited by examiner

PRIOR ART

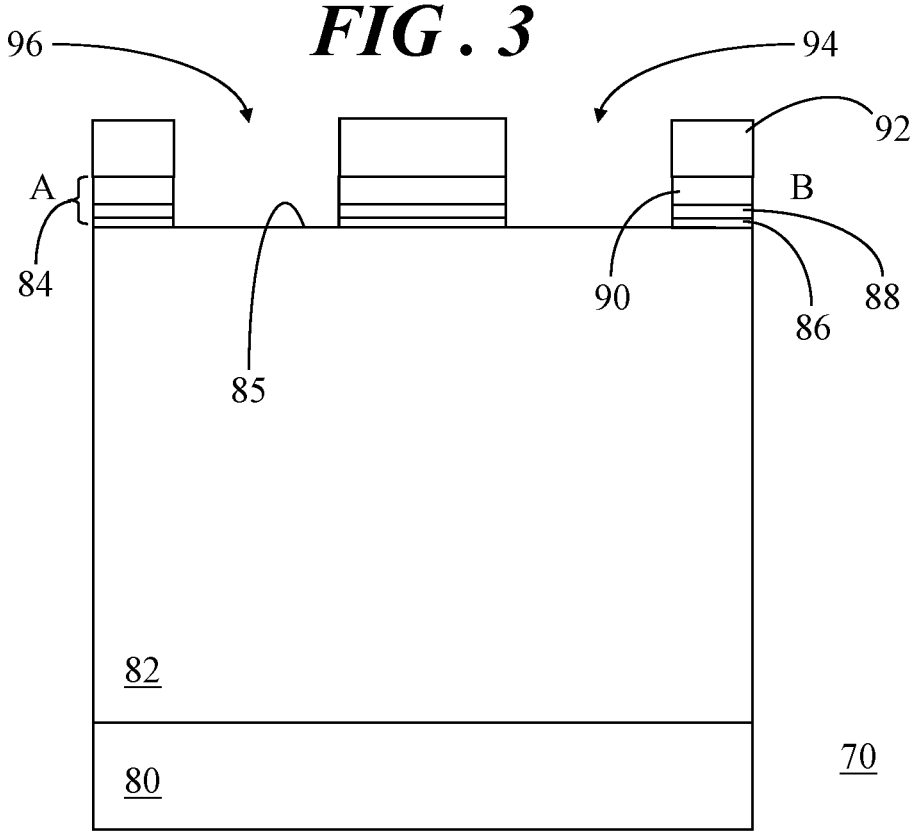
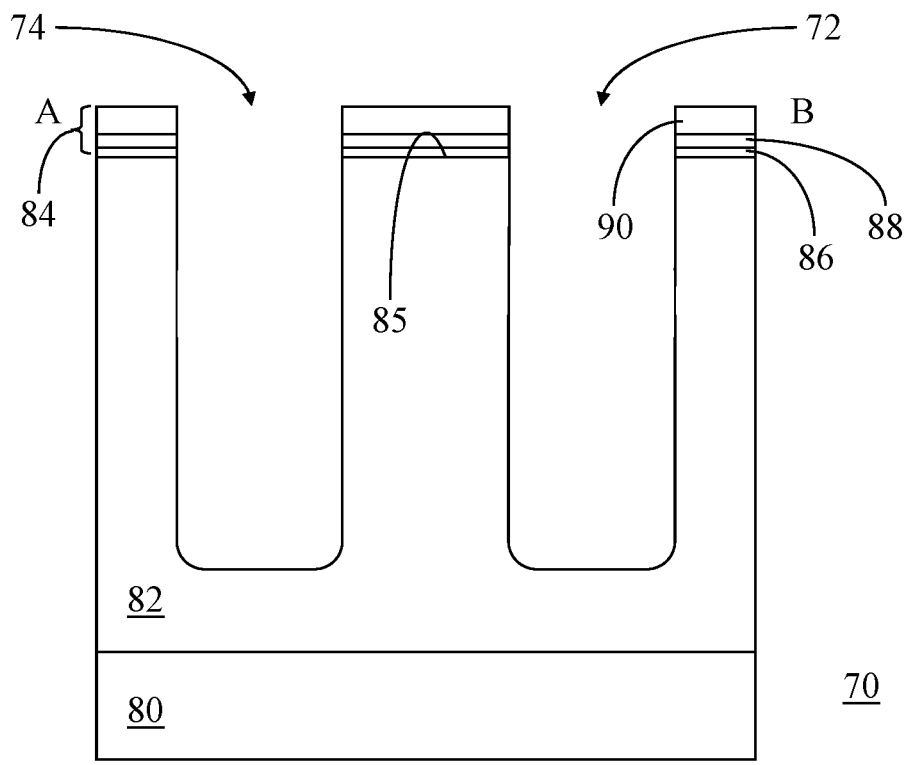

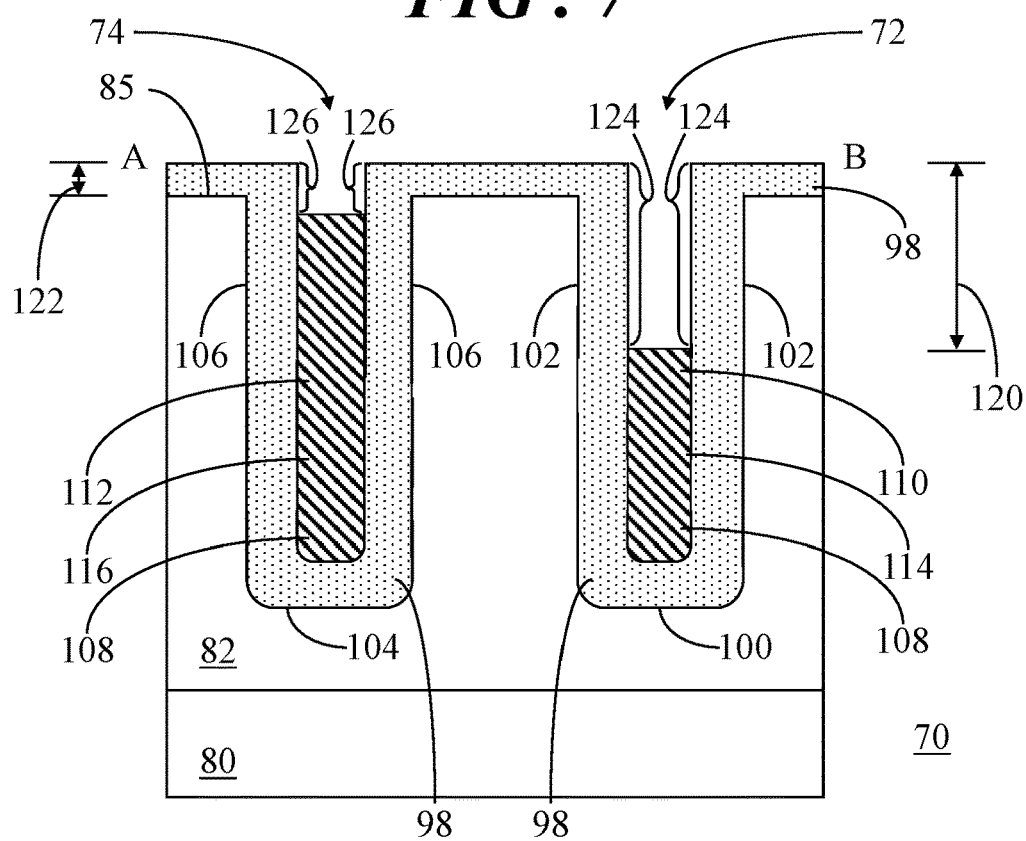
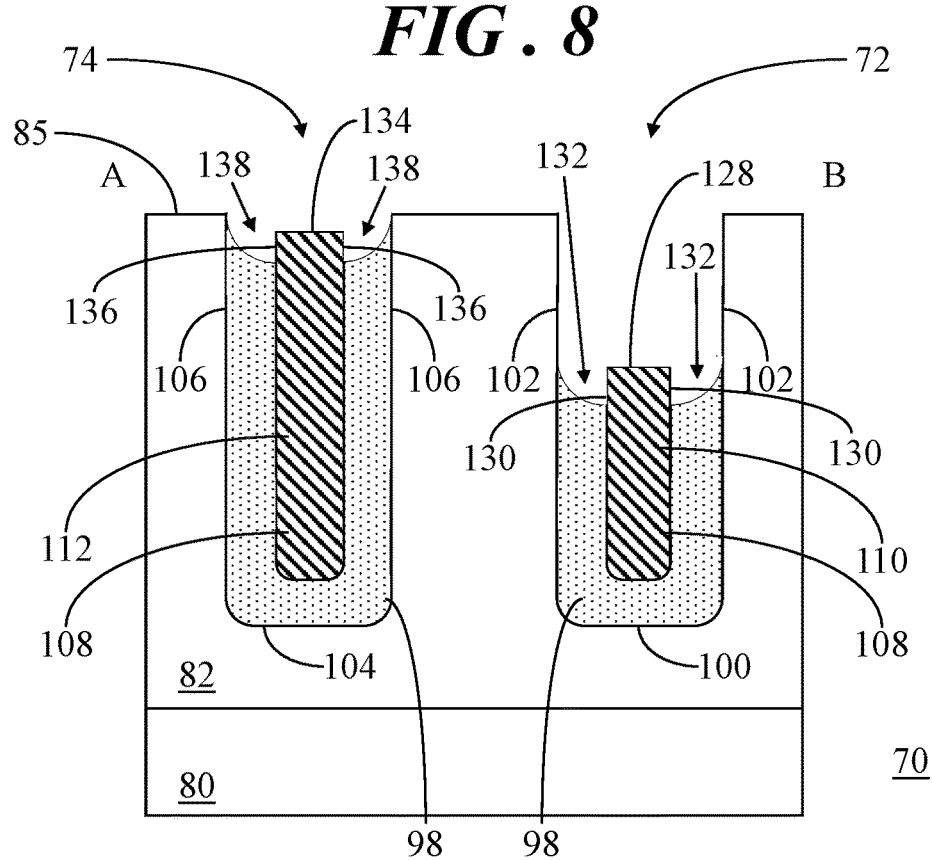

METHOD OF MANUFACTURE OF SUPER-JUNCTION POWER SEMICONDUCTOR DEVICE

TECHNICAL FIELD OF THE INVENTION

The present invention relates generally to semiconductor processing. More specifically, the present invention relates to a super-junction power semiconductor device and method for manufacturing same.

BACKGROUND OF THE INVENTION

Metal-oxide-semiconductor field effect transistors (MOSFETs) are commonly used in modern electronics as individual devices and as part of various integrated circuits (ICs). Particularly demanding applications of MOSFETs occur where they are intended to control large amounts of power, e.g., high currents. This type of MOSFET is generally referred to as a "power MOSFET." Power MOSFET devices based on super-junction technology are commonly used in high-voltage switching applications. A class of super-junction power MOSFET devices called trench field plate power MOSFET devices include trenches which extend into the body, each including both a polysilicon gate electrode and a polysilicon shield electrode. The gate and shield electrodes are insulated from each other by an inter-poly dielectric (IPD). The reliability of the gate electrodes may be limited by the IPD. That is, the topography within the trench can cause retardation of IPD oxidation growth and field crowding which can lead to high leakage and low breakdown voltage of the IPD. Such a situation can degrade the performance and long-term reliability of the super-junction power device.

SUMMARY

Aspects of the disclosure are defined in the accompanying claims.

In a first aspect, there is provided a method for manufacturing a super-junction MOSFET comprising forming a first trench in a semiconductor layer of a substrate; forming a first oxide layer over the semiconductor layer and in the first trench, wherein the first oxide layer is along a first bottom and first sidewalls of the first trench; depositing an electrically conductive material in the first trench to form a first shield electrode; removing a first portion of the electrically conductive material from the first trench, wherein a first part of the first oxide layer on the first sidewalls of the first trench is exposed from the electrically conductive material when the first portion of the electrically conductive material is removed; removing the first part of the first oxide layer from the first sidewalls of the first trench, the removing the first part of the first oxide layer additionally removing another part of the first oxide layer adjacent to first shield sidewalls of the first shield electrode to produce first openings along a first top part of the first shield sidewalls; forming a second oxide layer over and in contact with the first shield electrode, the second oxide layer filling the first openings; removing a second part of the second oxide layer to expose a first top surface of the first shield electrode; forming a gate dielectric over the first top surface of the first shield electrode; and depositing additional electrically conductive material over the gate dielectric in the first trench to form a gate electrode of the MOSFET.

In a second aspect, there is provided method of making a semiconductor device comprising forming a first mask over a semiconductor layer of a substrate, wherein the substrate includes a major surface, and a first trench and a second trench extend into the semiconductor layer from the major surface, each of the first and second trenches including a first dielectric layer along respective sidewalls and each of the first and second trenches being filled with a first polysilicon material, wherein the first mask is configured to cover the second trench; removing a first portion of the first polysilicon material from the first trench; removing the first mask; removing a second portion of the first polysilicon material from the first and second trenches to produce a first shield electrode in the first trench and a second shield electrode in the second trench, wherein a first part of the first dielectric layer on the sidewalls of the first trench is exposed from the electrically conductive material following removal of the first and second portions of the electrically conductive material; removing a first part of the first dielectric layer from the first and second trenches, wherein the removing the first part of the first dielectric layer removes the first dielectric layer from the sidewalls of the first trench, produces first openings along a first top part of the sidewalls of the first trench, and produces second openings along a second top part of the sidewalls of the second trench; forming a second dielectric layer over and in contact with the first and second shield electrodes, the second dielectric layer filling the first and second openings; removing a second part of the second dielectric layer to expose a first top surface of the first shield electrode, the first sidewalls of the first trench, and a second top surface of the second shield electrode; forming a gate dielectric over the first and second top surfaces of the first and second shield electrodes and over the first sidewalls of the first trench; and depositing a second polysilicon material in the first trench to form a gate electrode, wherein the gate dielectric remains between the first and second polysilicon materials in the first trench and the gate dielectric remains on the first sidewalls.

In a third aspect, there is provided method for manufacturing a super-junction MOSFET comprising forming a first trench in a semiconductor layer of a substrate; forming a first oxide layer over the semiconductor layer and in the first trench, wherein the first oxide layer is along a first bottom and first sidewalls of the first trench; depositing an electrically conductive material in the first trench to form a first shield electrode; removing a first portion of the electrically conductive material from the first trench, wherein a first part of the first oxide layer on the first sidewalls of the first trench is exposed from the electrically conductive material when the first portion of the electrically conductive material is removed; removing the first part of the first oxide layer from the first sidewalls of the first trench, the removing the first part of the first oxide layer additionally removing another part of the first oxide layer adjacent to first shield sidewalls of the first shield electrode to produce first openings along a first top part of the first shield sidewalls; forming a second oxide layer over and in contact with the first recessed portion of the first shield electrode, wherein the second oxide layer is applied to a depth great enough to entirely fill the first openings and the second oxide layer is formed along the first sidewalls of the first trench; removing a second part of the second oxide layer to expose a first top surface of the first shield electrode and to remove the second oxide layer from the first sidewalls of the trench to produce exposed sidewalls; forming a gate dielectric over the first top surface of the first shield electrode and on the exposed first sidewalls; and depositing additional electrically conductive material over the gate dielectric in the first trench to form a gate electrode of the MOSFET.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 3 shows a cross-sectional view of the super-junction power semiconductor device along section lines A-B in FIG. 2 at an initial stage of processing;

FIG. 4 shows a cross-sectional view of the super-junction power semiconductor device of FIG. 3 at a subsequent stage of processing;

FIG. 7 shows a cross-sectional view of the super-junction power semiconductor device of FIG. 6 at a subsequent stage of processing;

FIG. 8 shows a cross-sectional view of the super-junction power semiconductor device of FIG. 7 at a subsequent stage of processing;

DETAILED DESCRIPTION

Figure 1:
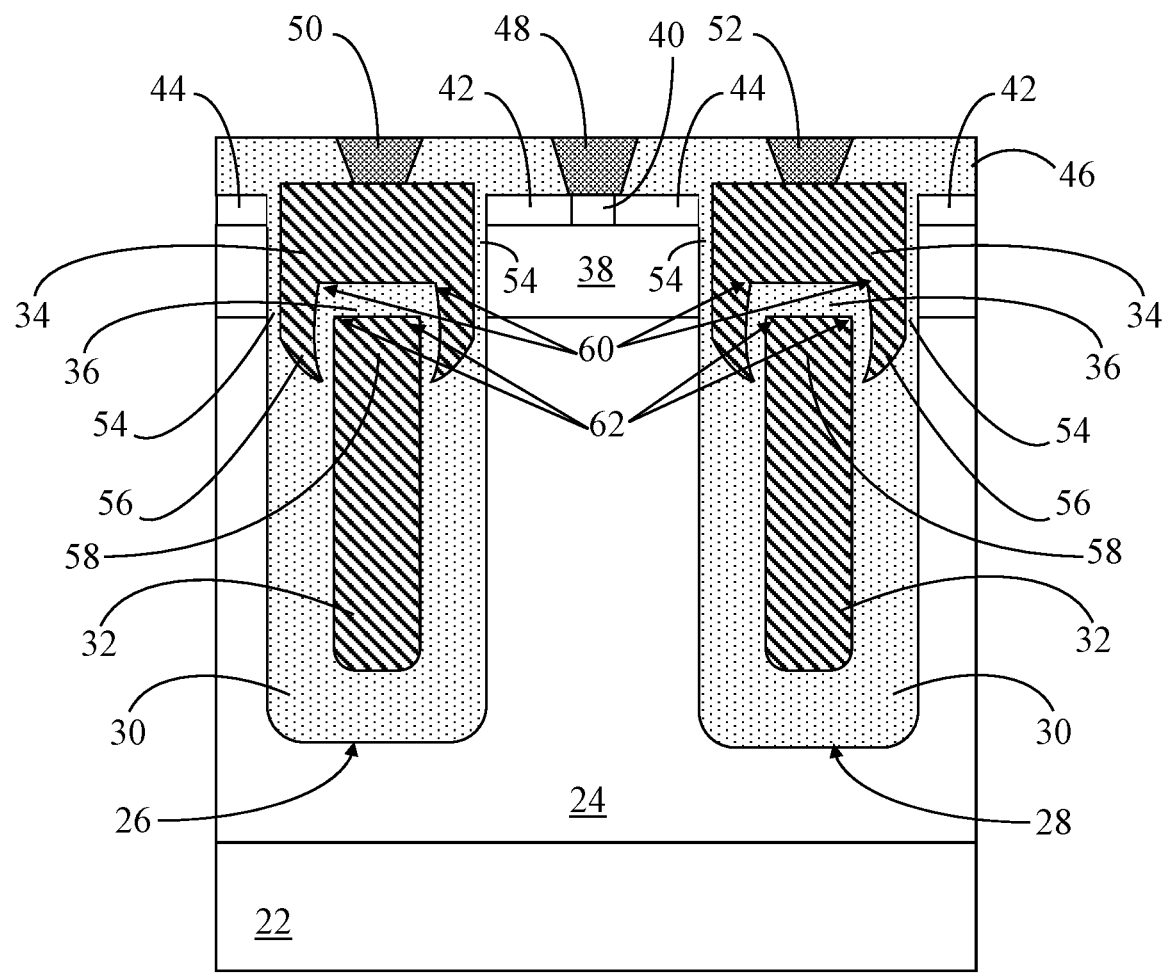
FIG. 1 shows a partial cross-sectional view of a prior art super-junction power semiconductor device.

In overview, the present disclosure concerns a super-junction power semiconductor device, such as a metal-oxide-semiconductor field effect transistor (MOSFET), and methodology for manufacturing the super-junction power MOSFET. More particularly, methodology integrates oxide redeposition and etch-back into process flow to yield an inter-poly dielectric layer (IPD) having an improved topography to thereby increase IPD voltage breakdown and decrease leakage relative to prior devices. Oxide redeposition and etch-back may be integrated into the process flow without requiring additional photolithography or other processes to cost effectively achieve improvements in the performance and long-term reliability of the super-junction power device.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. Although the abbreviation "MOS" and "MOSFET" and the terms for which they stand, literally refer to a FET having a metal gate electrode and an oxide gate insulator, the abbreviations MOS and MOSFET and the terms for which they stand are used throughout to refer to any semiconductor device that includes a conductive gate (whether metal or not) that is positioned over a gate insulator (whether oxide or other dielectric) which, in turn, is positioned over a semiconductor substrate. Accordingly, the term metal-oxide-semiconductor and the abbreviations "MOS" and "MOSFET" are used herein even though such devices may not employ just metals or oxides but conductive materials other than metals, and insulating materials other than oxides. Non-limiting examples of conductive materials suitable for use in MOS and MOSFETs are metals, metal alloys, semi-metals, metal-semiconductor alloys or compounds, doped semiconductors, combinations thereof. Non-limiting examples of insulating materials suitable for use in MOS and MOSFETs are oxides, nitrides, oxy-nitrides mixtures, organic insulating materials and other dielectrics.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures, bulk or semiconductor-on-insulator (SOI) structures.

For convenience of explanation and not intended to be limiting, semiconductor devices and methods of fabrication are described herein for silicon semiconductors, but persons of skill in the art will understand that other semiconductor materials may also be used. Additionally, various device types and/or doped semiconductor regions may be identified as being of N type or P type, but this is merely for convenience of description and not intended to be limiting, and such identification may be replaced by the more general description of being of a "first conductivity type" or a "second, opposite conductivity type", where the first conductivity type may be either N or P type and the second conductivity type is then either P or N type. Various embodiments of the invention will be illustrated for N-channel MOSFETs but, again, this is merely for convenience of description and is not intended to be limiting. Persons of skill in the art will understand that P-channel MOSFETs and other semiconductor devices and circuits embodying either or both N-channel and P-channel combinations may be provided by appropriate interchange of conductivity types in the various regions.

FIG. 1 shows a partial cross-sectional view of a prior art super-junction power semiconductor device 20, e.g., a super-junction power MOSFET. Device 20 includes a semiconductor substrate 22 and a semiconductor layer 24 over substrate 22. In an example, substrate 22 is a silicon substrate, and may be a heavily doped N-type (N++) substrate, and semiconductor layer 24 may be an N-type epitaxial silicon layer. Trenches 26, 28 are formed extending into semiconductor layer 24 above substrate 22. Any number of trenches may be formed. Additionally, each trench extends into and out of the page. Trenches 26, 28 are lined with a dielectric material 30 and each of trenches 26, 28 includes both a polysilicon shield electrode 32 and a polysilicon gate electrode 34. Shield and gate electrodes 32, 34 are insulated from one another by an inter-poly dielectric (IPD) material 36 (e.g., an oxide material). Shield electrodes 32 are tied to the source in normal device operation for getting a low QGD, which is a figure of merit for such super-junction power semiconductor devices.

Device 20 further includes a body implant region 38, which may be a high voltage P-region (e.g., Phv) in some examples. Implant regions in body region 38 between trenches 26, 28 can include, for example, heavily doped P+ regions 40 (one shown) and heavily doped N+ regions 42, 44 formed on either side of P+ regions 40. In some embodiments, boron, may be used as a P-type dopant and phosphorus or arsenic may be used as an N-type dopant. However, other suitable P-type and N-type dopants at suitable doping concentrations may be utilized.

An interlevel dielectric 46 is formed on semiconductor layer 24 and over trenches 26, 28. Source contacts 48 (one shown) extend through interlevel dielectric 46 and are in contact with P+ regions 40. Source contacts 48 also contact N+ regions 42, 44. Source contacts 48 are thereby shorted to body region 38. Additionally, gate contacts 50, 52 extend through interlevel dielectric 46 to contact gate electrodes 34. A dielectric, e.g., a gate oxide 54, is adjacent to opposing sides of gate electrodes 34 in trenches 26, 28. Gate oxide 54 isolates gate electrodes 34 from body region 38 to form a vertical channel. Gate oxide 54 thus appears in parallel to IPD 36. Accordingly, the reliability of gate electrodes 34 is governed by both gate oxide 54 and IPD 36.

Process operations for forming super-junction power semiconductor device can result in a topology that includes fang regions 56 of polysilicon gate electrodes 34 wrapping around or otherwise surrounding a top portion 58 of shield electrodes 32. Additionally, sharp corners can be formed in bottom corners 60 of polysilicon gate electrodes 34 and in top corners 62 of polysilicon shield electrodes 32. The growth of IPD material 36 suffers at fang regions 56, thereby making IPD 36 thinner and weaker. Thin IPD 36 at fang regions 56 governs the IPD breakdown voltage. Further, sharp corners at bottom corners 60 of polysilicon gate electrodes 34 and in top corners 62 of polysilicon shield electrodes 32 may lead to field crowding and high current through IPD 36. As such, the intrinsic quality of IPD 36 may be worse than the high quality thermal gate oxide 54 grown on crystalline silicon such that the lower quality of IPD 36 governs gate reliability. Embodiments described herein include process operations that reduce or eliminate fang regions 56 thereby improving the quality of the inter-poly dielectric and the breakdown voltage so that the reliability of the gates is more suitably governed by gate oxide 54.

Figure 2:
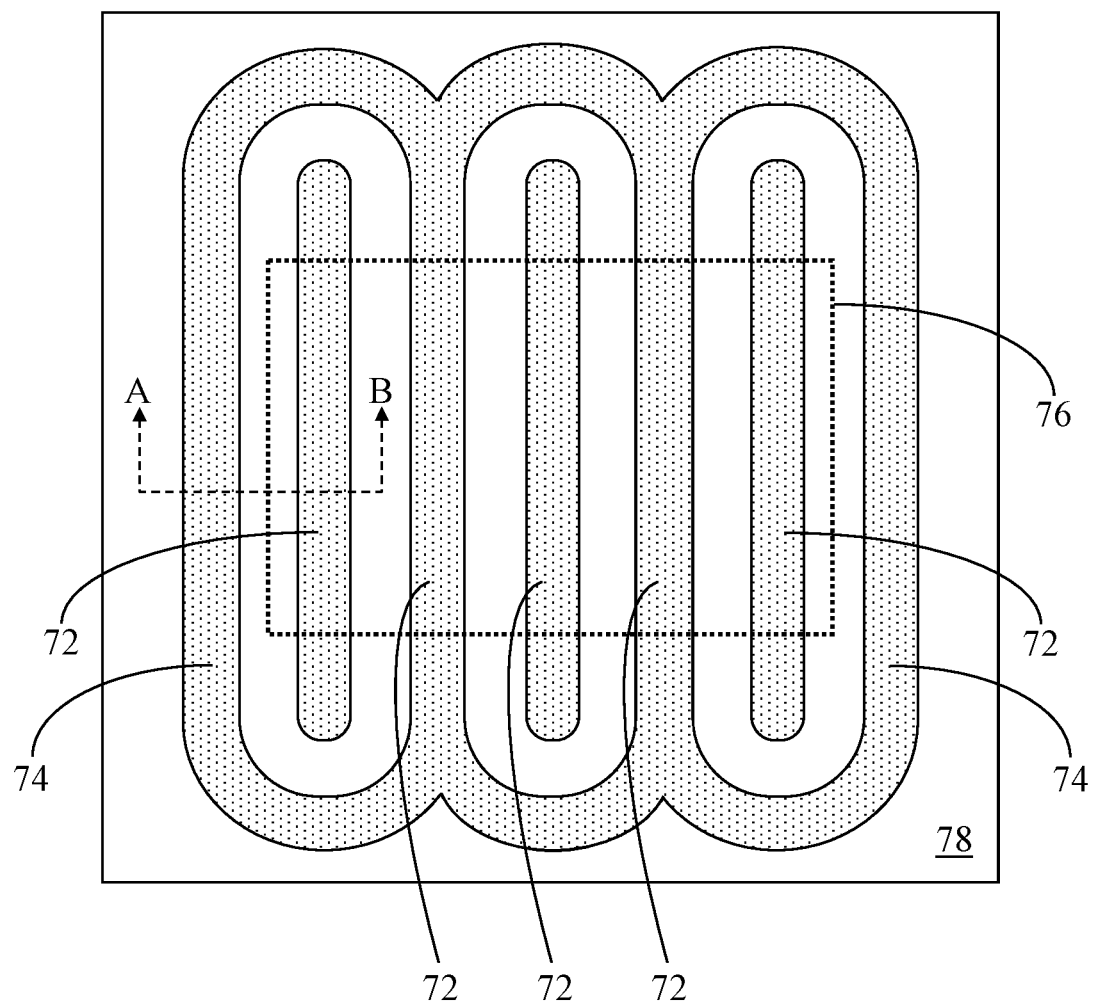
FIG. 2 shows a plan view of a super-junction power semiconductor device in accordance with an embodiment.

FIG. 2 shows a plan view of a super-junction power semiconductor device 70, which may be a super-junction power MOSFET, in accordance with an embodiment. For simplicity, device 70 will be referred to hereinafter as power MOSFET 70. In general, power MOSFET 70 includes a plurality of parallel trenches, only a few of which are shown for simplicity. However, any number of trenches may be formed. Typically, shield polysilicon is present everywhere that the trenches are etched. As will be discussed in detail below, the shield polysilicon is recessed using a mask, and gate polysilicon is later deposited to form core trenches 72 in the active area (denoted by the dashed line box 76) of power MOSFET 70. The inter-poly dielectric material is contained inside active area 76 of power MOSFET 70 between polysilicon shield and gate electrodes. Termination trenches 74 are contained outside of active area 76. The region outside of active area 76 (e.g., outside of the dashed line box) is covered by a shield recess mask to form a device termination area 78 for termination trenches 74. The shield polysilicon extends all the way to the top in termination trenches 74. A process flow in accordance with some embodiments will be discussed below in connection with section A-B of FIG. 2 in the subsequent figures, thus encompassing both core and termination trenches 72, 74.

FIG. 3 shows a cross-sectional view of power MOSFET 70 along section lines A-B in FIG. 2 at an initial stage of processing. Power MOSFET 70 includes a semiconductor substrate 80 and a semiconductor layer 82 over substrate 80. In an example, substrate 80 is a silicon substrate, and may be a heavily doped N-type (N++) substrate, and semiconductor layer 82 may be an N-type epitaxial silicon layer. In alternate embodiments, semiconductor substrate 80 can include any semiconductor material or combinations of materials, such as gallium arsenide, silicon germanium, silicon, monocrystalline silicon, the like, and combinations of the above.

At this initial stage of processing, a hard mask 84 is formed over semiconductor layer 82 (e.g., is formed over a major surface 85 of layer 82). To form hard mask 84, an oxide layer 86 may be grown on semiconductor layer 82, a nitride layer 88 may be formed over oxide layer 86, and an oxide layer 90 may be formed over nitride layer 88. In alternate embodiments, hard mask 84 can be formed using more or fewer layers, or different materials. A patterned photoresist 92 is formed over hard mask 84 to define openings, and an etch may be performed using patterned photoresist 92 to form openings 94, 96 through hard mask 84. Thereafter photoresist 92 is removed.

FIG. 4 shows a cross-sectional view of power MOSFET 70 of FIG. 3 at a subsequent stage of processing. Another etch process may be performed to extend openings 94, 96 (FIG. 3) into semiconductor layer 82 to form a first trench (e.g., one of core trenches 72) and a second trench (e.g., one of termination trenches 74). In the illustrated example, each of trenches 72, 74 extends into semiconductor layer 82 above semiconductor substrate 80. However, trenches 72, 74 may additionally extend into semiconductor substrate 80.

Figure 5:
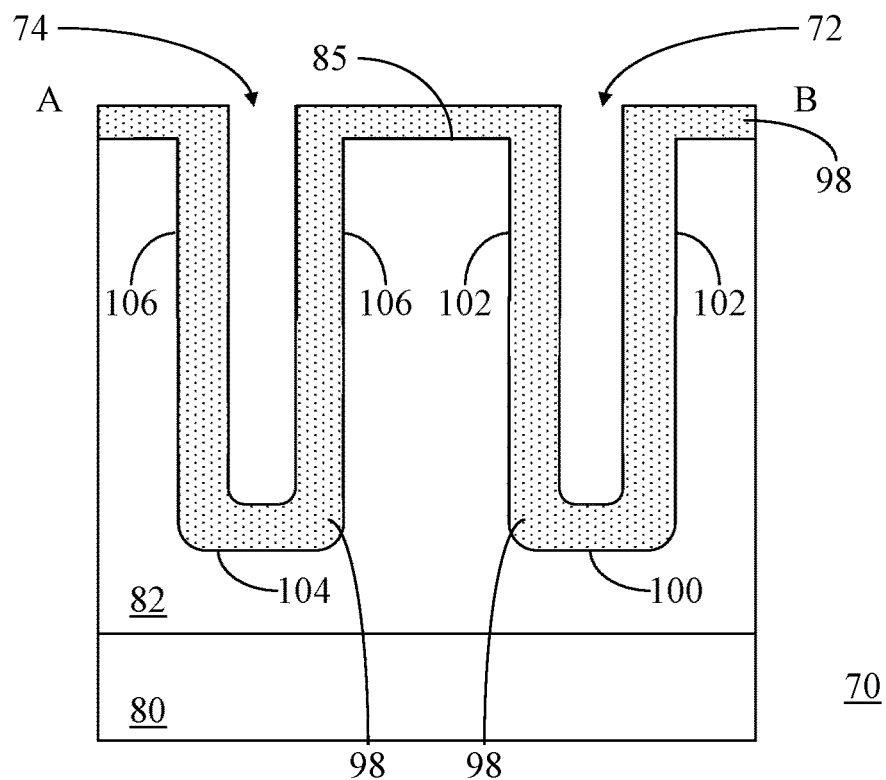
FIG. 5 shows a cross-sectional view of the super-junction power semiconductor device of FIG. 4 at a subsequent stage of processing.

FIG. 5 shows a cross-sectional view of power MOSFET 70 of FIG. 4 at a subsequent stage of processing in which a first oxide layer 98 is formed over major surface 85 of semiconductor layer 82 and within trenches 72, 74. Thus, first oxide layer 98 is formed along a first bottom 100 and first sidewalls 102 of trench 72, and first oxide layer 98 is formed along a second bottom 104 and second sidewalls 106 of trench 74. FIG. 5 does not show hard mask 84 (FIG. 4) for simplicity. However, it should be understood that hard mask 84 may still be present such that first oxide layer 98 is blanket deposited over the hard mask and within trenches 72, 74.

Figure 6:
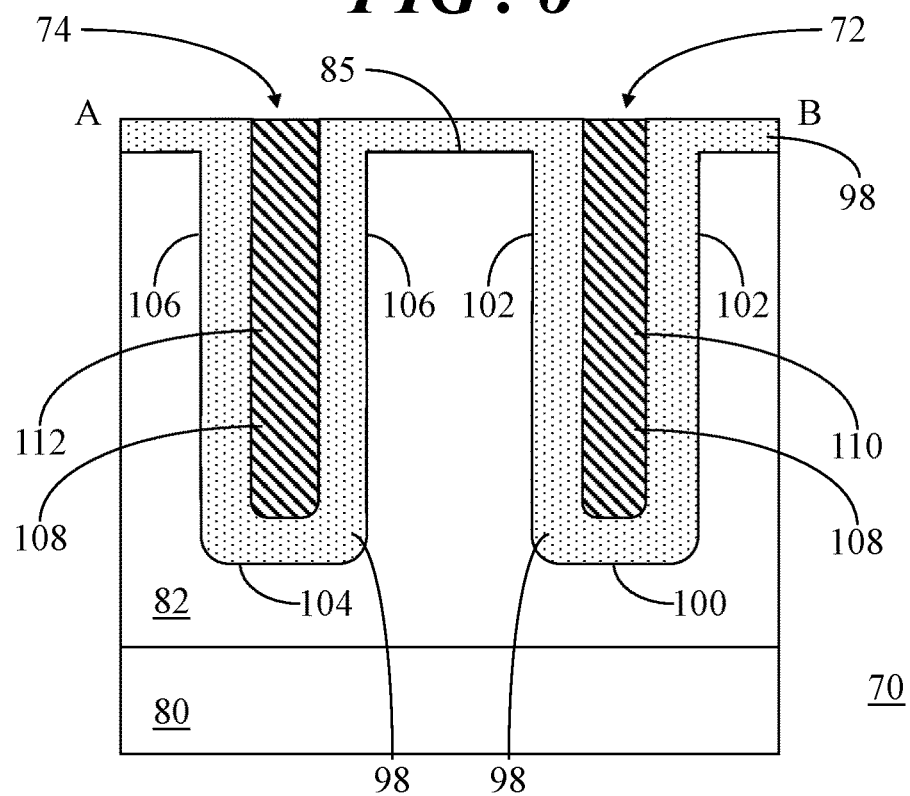
FIG. 6 shows a cross-sectional view of the super-junction power semiconductor device of FIG. 5 at a subsequent stage of processing.

FIG. 6 shows a cross-sectional view of power MOSFET 70 of FIG. 5 at a subsequent stage of processing in which electrically conductive material 108 (e.g., polysilicon) is deposited in trench 72 to form a first shield electrode 110 and electrically conductive material 108 is deposited in trench 74 to form a second shield electrode 112. Therefore, in each of trenches 72, 74, there is an oxide liner lining the trench and a polysilicon fill. A chemical-mechanical polishing (CMP) process may be performed to remove material that extends above the hard mask (not shown) and to remove at least some portions of the hard mask.

FIG. 7 shows a cross-sectional view of power MOSFET 70 of FIG. 6 at a subsequent stage of processing in which a first recessed portion 114 of electrically conductive material 108 is formed in trench 72 and a second recessed portion 116 of electrically conductive material 108 is formed in trench 74. That is, a portion of electrically conductive material 108 is removed from trench 72 to form first recessed portion 114, which is thus first shield electrode 110, and a portion of electrically conductive material 108 is removed from trench 74 to form second recessed portion 116, which is thus second shield electrode 112.

Electrically conductive material 108 may be recessed using a combination of masked and blanket etch processes. In an example, a patterned photoresist layer (not shown) may be formed over oxide layer 98 that covers trench 74 and exposes trench 72. The patterned photoresist protects second shield electrode 112 while exposing first shield electrode 110. Thereafter, a masked etch process may be performed using the patterned photoresist to remove a top portion of first shield electrode 110 while second shield electrode 112 is protected from the etch. That is, only those electrodes (e.g., first shield electrode 110) not protected by the photoresist are recessed from a top surface of semiconductor layer 82. In some embodiments, the masked etch process may be deeper by 0.5-0.8 microns relative to the standard integration to yield the same gate length (discussed below).

Next, the photoresist may be stripped and a blanket etch may be performed to remove another portion of first shield electrode 110 and a portion of second shield electrode 112 such that each of first and second shield electrodes 110, 112 is recessed below a top surface, referred to herein as major surface 85, of semiconductor layer 82. Accordingly, the combination of masked and blanket etch processes may yield removal of electrically conductive material 108 to a first depth 120 in first trench 72 and removal of electrically conductive material 108 to a second depth 122 in second trench 74 in which second depth 122 is less than first depth 120. Thus, first shield electrode 110 will be more deeply recessed in trench 72 relative to second shield electrode 112 in second trench 74.

The structure of power MOSFET 70 is typically referred to as a vertically-conducting trench MOSFET having a vertical channel in which the current flows from bottom to top of the vertical channel. Per convention this vertical dimension is referred to as a "gate length" of the gate electrode. In other words, the "gate length" represents the depth of the gate electrode. In order to maintain the same gate length of the prior art design shown in FIG. 1, first depth 120 is greater than a depth of etching used to form shield electrode 32 of the prior art design. In an example, the etch depth may be greater by approximately 0.5-0.8 microns than the standard integration to achieve the same gate length of the gate electrode. Thus, first shield electrode 110 may be shorter than shield electrode 32 (FIG. 1). Such is the case because gate electrode 34 of the prior art design partially wraps around shield electrode 32. However, in accordance with an embodiment, the gate electrodes will largely reside above the shield electrodes in core trenches 74, as will be illustrated in FIG. 12.

In response to the formation of first recessed portion 114, a first part 124 of first oxide layer 98 on first sidewalls 102 of trench 72 is exposed from electrically conductive material 108. Similarly, in response to the formation of second recessed portion 116, a second part 126 of first oxide layer 98 on second sidewalls 106 of trench 74 may be exposed from electrically conductive material 108.

FIG. 8 shows a cross-sectional view of power MOSFET 70 of FIG. 7 at a subsequent stage of processing in which first part 124 (FIG. 7) of first oxide layer 98 is removed from first sidewalls 102 of trench 72 and second part 126 (FIG. 7) of first oxide layer 98 is removed from trench 74. First oxide layer 98 may be removed using, for example, a buffered oxide etch (BOE) process. Removal of first part 124 of first oxide layer 98 additionally removes, or clears, first oxide layer 98 from a first top surface 128 of first shield electrode 110 and removes first oxide layer 98 adjacent to first shield sidewalls 130 of first shield electrode 110 to produce first openings 132 along a top part of first shield sidewalls 130. Similarly, removal of second part 126 of first oxide layer 98 may additionally clear first oxide layer 98 from a second top surface 134 of second shield electrode 112 and remove first oxide layer 98 adjacent to second shield sidewalls 136 of second shield electrode 112 to produce second openings 138 along a top part of second shield sidewalls 136 in some embodiments.

In prior art fabrication processes, fang regions (e.g., fang regions 56 of FIG. 1) may be formed in first openings 132 when polysilicon is deposited to form the gate electrodes. Additionally, polysilicon stringers (e.g., regions of polysilicon) may be formed in second openings 138 when the polysilicon is deposited to form the gate electrodes. While the polysilicon stringers may be removed by, for example, CMP and etching in the final product, the polysilicon fang regions may remain as discussed above in connection with FIG. 1. In accordance with embodiments discussed below, fabrication methodology implements oxide redeposition and etch-back integration into process flow to yield an inter-poly dielectric layer (IPD) with the fang regions largely reduced or entirely eliminated.

Figure 9:
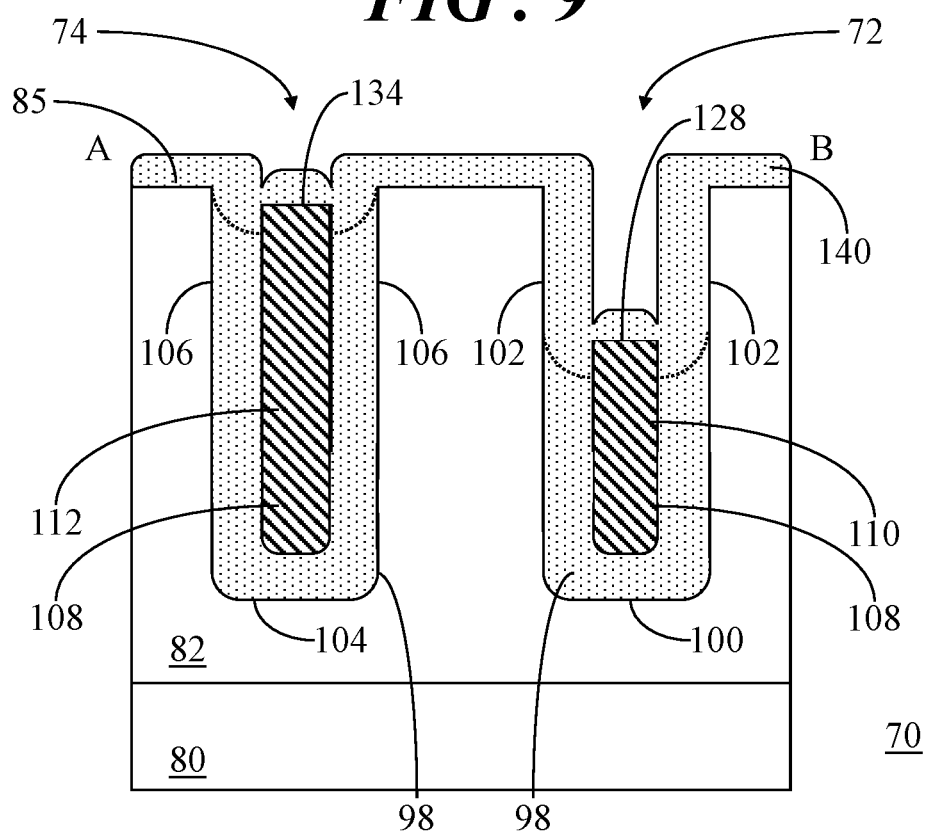
FIG. 9 shows a cross-sectional view of the super-junction power semiconductor device of FIG. 8 at a subsequent stage of processing.

FIG. 9 shows a cross-sectional view of power MOSFET 70 of FIG. 8 at a subsequent stage of processing in which a second oxide layer 140 is formed over and in contact with first and second shield electrodes 110, 112, respectively. The forming of second oxide layer 140 can be referred to as an oxide redeposition process integrated within the process flow. The oxide may be tetraethyl orthosilicate (TEOS) in some embodiments. However, other suitable materials may alternatively be utilized. Second oxide layer 140 is applied to a depth that is great enough to entirely fill first openings 132 (FIG. 8) and second openings 138 (FIG. 8). Further, second oxide layer 140 is formed along the exposed first sidewalls 102 of first trench 72. If any of second sidewalls 106 of second trench 74 were exposed, second oxide layer 140 is also formed along those exposed second sidewalls 106 of second trench 74. In FIG. 9, dotted lines show the boundary of the original first oxide layer 98.

Figure 10:
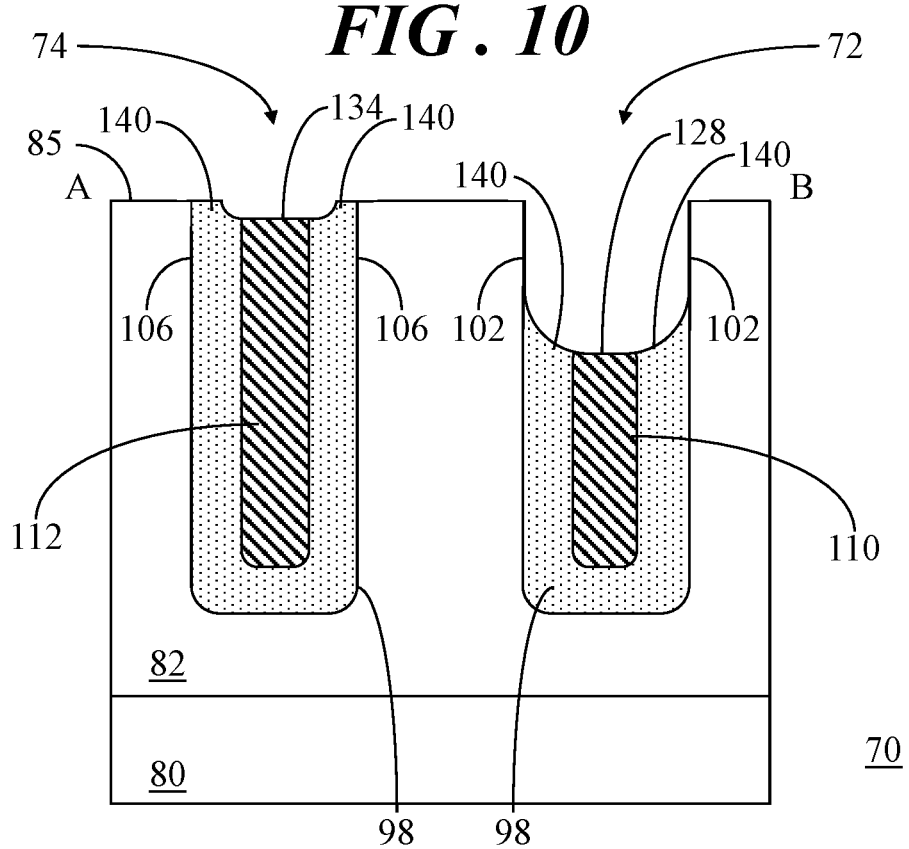
FIG. 10 shows a cross-sectional view of the super-junction power semiconductor device of FIG. 9 at a subsequent stage of processing.

FIG. 10 shows a cross-sectional view of power MOSFET 70 of FIG. 9 at a subsequent stage of processing in which parts of second oxide layer 140 are removed to again expose first top surface 128 of first shield electrode 110 and to again expose second top surface 134 of second shield electrode 112. Removal of second oxide layer 140 may further entail removing second oxide layer 140 from first sidewalls 102 of first trench 72. The selective removal of second oxide layer 140 can be referred to as an etch-back process integrated within the process flow. In some embodiments, the redeposited second oxide layer 140 (e.g., TEOS) may be isotropically etched using BOE. BOE is targeted to expose first and top surfaces 128, 134 of the shield polysilicon (e.g., first and second shield electrodes 110, 112) and to clear second oxide layer 140 from the silicon sidewalls (e.g., first sidewalls 102).

Figure 11:
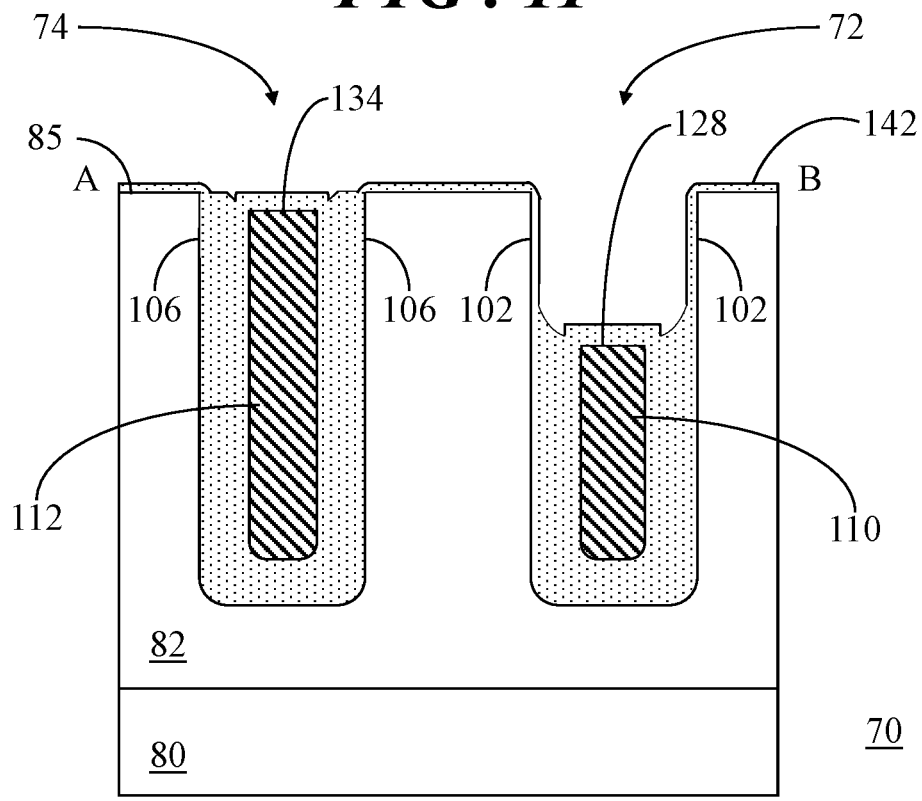
FIG. 11 shows a cross-sectional view of the super-junction power semiconductor device of FIG. 10 at a subsequent stage of processing.

FIG. 11 shows a cross-sectional view of power MOSFET 70 of FIG. 10 at a subsequent stage of processing in which a gate dielectric 142 is formed over first and second top surfaces 128, 134 of first and second shield electrodes 110, 112 and along the sidewalls (e.g., first and second sidewalls 102, 106) of trenches 72, 74. In some embodiments, gate dielectric 142 may be formed by thermal oxidation to grow an oxide layer over first and second top surfaces 128, 134 of first and second shield electrodes 110, 112 and along the sidewalls (e.g., first and second sidewalls 102, 106) of trenches 72, 74. Gate dielectric 142 may also be formed on major surface 85 of semiconductor layer 82. In other embodiments, major surface 85 of semiconductor layer 82 may be suitably masked so that gate dielectric 142 is only formed in trenches 72, 74.

Figure 12:
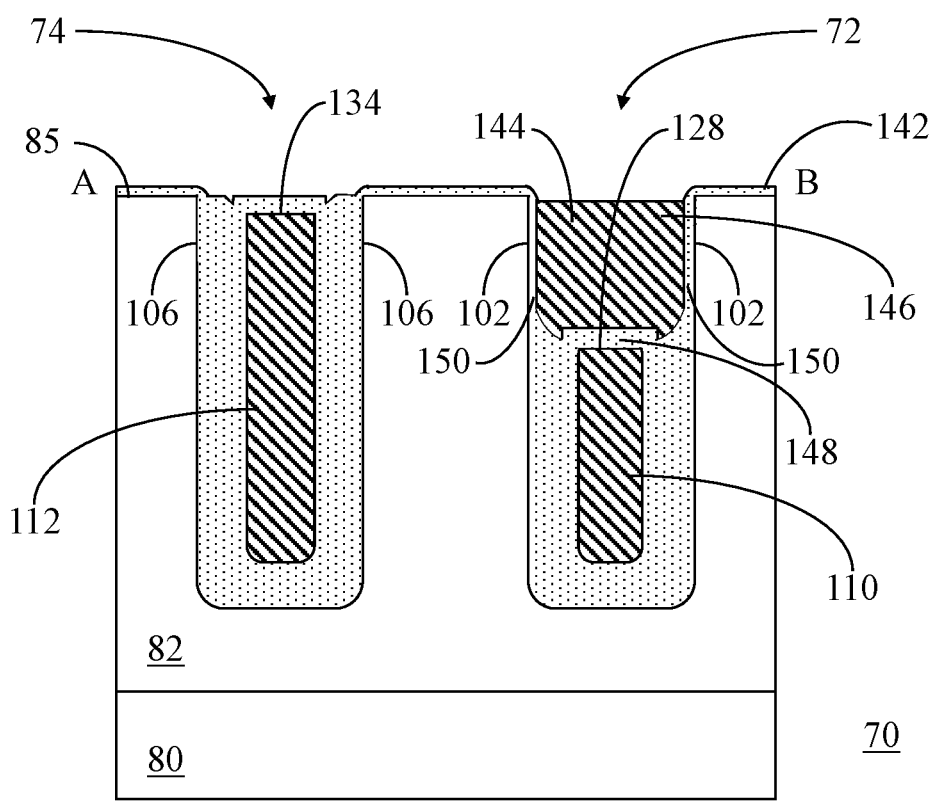
FIG. 12 shows a cross-sectional view of the super-junction power semiconductor device of FIG. 11 at a subsequent stage of processing.

FIG. 12 shows a cross-sectional view of power MOSFET 70 of FIG. 11 at a subsequent stage of processing in which additional electrically conductive material 144 (e.g., a polysilicon layer) is deposited over gate dielectric 142 in trench 72 to form a gate electrode 146. By way of example, electrically conductive material 144 may be suitably deposited over device 70, filling the empty portions of trenches 72, 74. Chemical-mechanical polishing followed by a polysilicon etch process may be performed to form gate electrode 146 in which the top surface of gate electrode 146 is at or below major surface 85 of semiconductor layer 82. In this manner, gate electrode 146 is formed over first shield electrode 110, separated by a dielectric oxide material (e.g., gate dielectric 142), referred to herein as an inter-poly dielectric 148 (IPD). Additionally, the dielectric oxide material (e.g., gate dielectric 142) is suitably formed on first sidewalls 102 of trench 72 to yield gate oxide 150 adjacent to opposing sides of gate electrode 146 which isolates gate electrode 146 from semiconductor layer 82. Different dielectrics, other than or in addition to oxide, may be used for gate oxide 150 and inter-poly dielectric 148.

In one embodiment, gate oxide 150 has a thickness in a range of 300-1500 Angstroms, such as, for example, 800 Angstroms. In one embodiment, the width of each inter-poly dielectric 148 between a gate electrode 146 and a corresponding shield electrode 110 is in a range of 0.2 to 0.5 microns, such as, for example, 0.35 microns. In one embodiment, the width of each trench 72, 74 is in a range of 1 to 3 microns, such as, for example, 1.6 microns. The depth of each trench is in a range of 3 to 8 microns, such as for example 5.5 microns. In one embodiment, the width between trenches 72, 74 is in the range of 0.5 to 2 microns, such as, for example, 1.2 microns.

Due to the TEOS redeposition and isotropic etch-back processes discussed in connection with FIGS. 9 and 10, fang regions (e.g., fang regions 56 of FIG. 1) are absent or considerably reduced. This may lead to significant improvements in the breakdown voltage for IPD 148 so that IPD 148 is stronger than gate oxide 150. Further, the problem of field crowding and high current through the IPD 148 may be reduced since gate electrode 146 resides above and therefore does not wrap around first shield electrode 110. Still further, the fang regions are greatly reduced or eliminated without a requirement for additional masks and photolithography steps. Additionally, no electrically conductive material 144 remains in the termination trenches (e.g., trench 74). Therefore, a polysilicon stringer etch mask may no longer be required since polysilicon stringers may not be formed in the terminal trenches.

Figure 13:
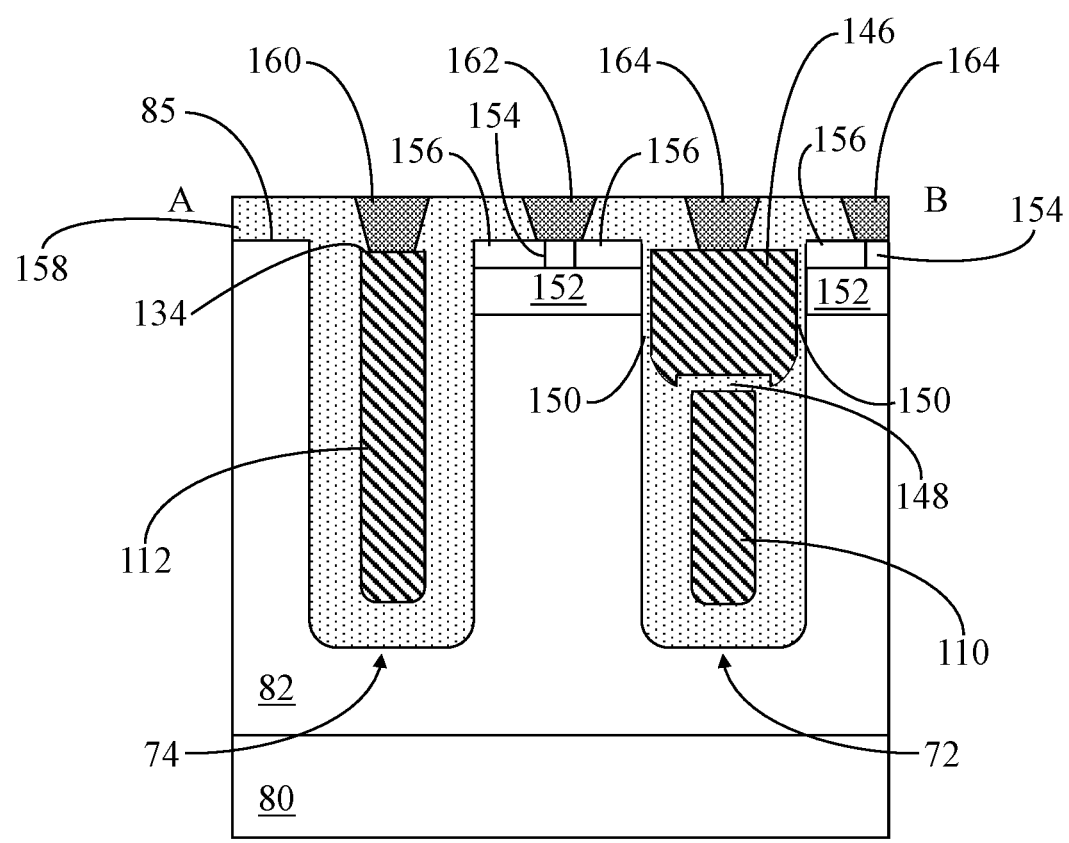
FIG. 13 shows a cross-sectional view of the super-junction power semiconductor device of FIG. 12 at a subsequent stage of processing.

FIG. 13 shows a cross-sectional view of power MOSFET 70 of FIG. 12 at a subsequent stage of processing. If a nitride layer is present, it is removed from major surface 85 of semiconductor layer 82. Additionally or alternatively, gate dielectric 142 (FIG. 12) may be removed from major surface 85 of semiconductor layer 82 and from second top surface 134 of second shield electrode 112 following formation of gate electrode 146. Body implants may be performed into a top portion of semiconductor layer 82, resulting in implant regions between trenches 72, 74 and to the right of trench 72 in this illustration. The implant regions can include, for example, a body region 152, which may be a high voltage P-region (e.g., Phv). Additional implant regions can include heavily doped P+ regions 154 and heavily doped N+ regions 156. An interlevel dielectric 158 is formed over major surface 85 of semiconductor layer 82 and trenches 72, 74 by, for example, blanket deposition of an oxide layer. Shield, source, and gate contacts 160, 162, 164 may be formed extending through interlevel dielectric 158. Thus, FIG. 13 shows power MOSFET 70 following implants and backend processing.

Figure 14:
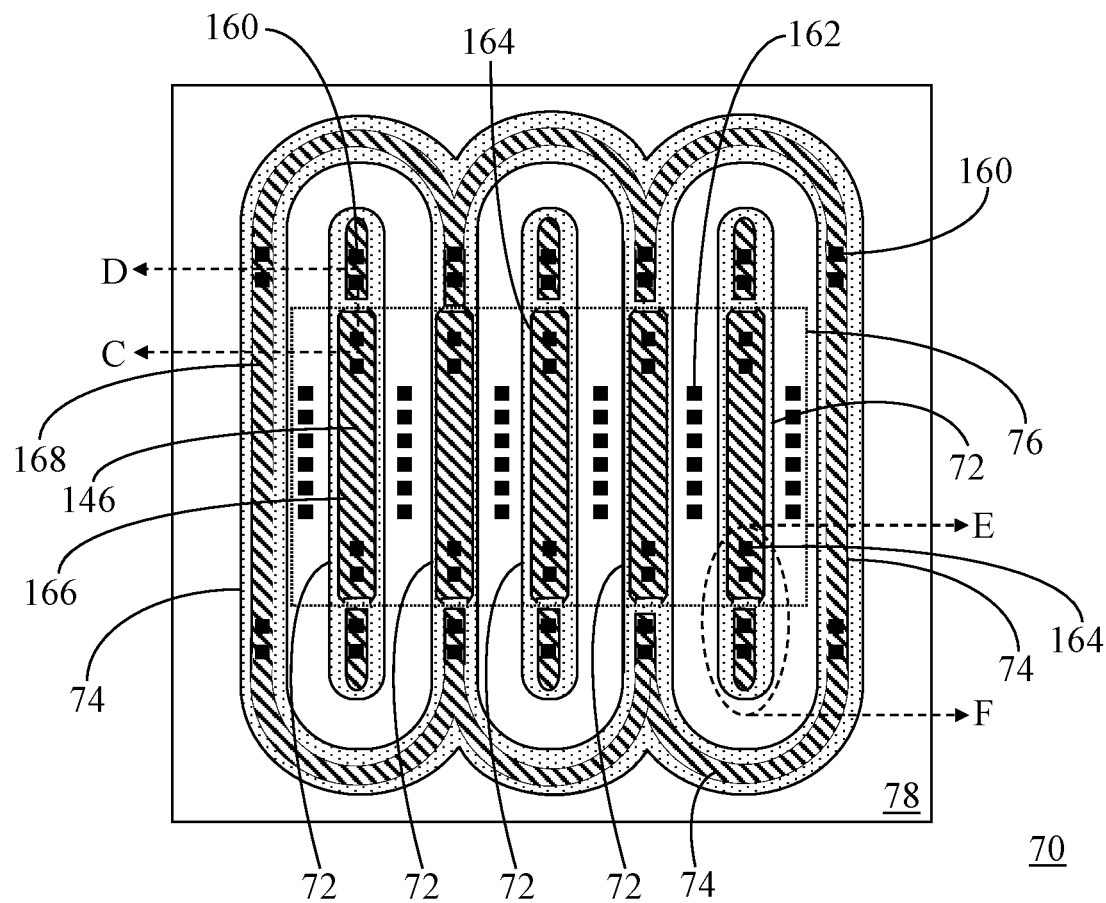
FIG. 14 shows a plan view of the super-junction power semiconductor device following processing.
Figure 15:
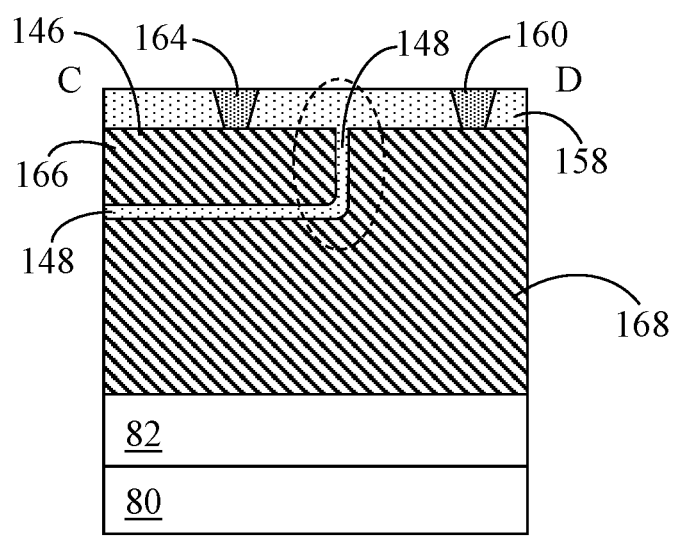
FIG. 15 shows a cross-sectional view of the super-junction power semiconductor device along section lines C-D of FIG. 14.
Figure 16:
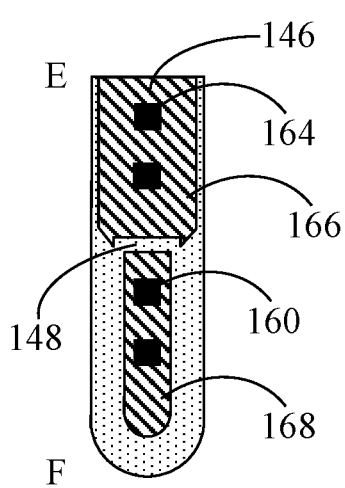
FIG. 16 shows an enlarged plan view of the super-junction power semiconductor device at a region E-F of FIG. 14.

Referring to FIGS. 14-16, FIG. 14 shows a simplified plan view of power MOSFET 70 following processing, FIG. 15 shows a cross-sectional view of power MOSFET 70 along section lines C-D of FIG. 14, and FIG. 16 shows an enlarged plan view of power MOSFET 70 at a region E-F of FIG. 14. Power MOSFET 70 includes parallel core trenches 72 within active area 76 and termination trenches 74 within termination area 78 outside of active area 76. Gate polysilicon 166 that makes up gate electrodes 146 is present in active area 76 and shield polysilicon 168 is present in device termination area 78 outside of active area 76. Shield polysilicon 168 is also present in active area 76. However, it is under gate polysilicon 168 and is therefore not visible from the top, plan view. The various shield, source, and gate contacts 160, 162, 164 are represented by filled squares in FIGS. 14 and 16. The cross-sectional view of FIG. 15 shows inter-poly dielectric 148 between shield polysilicon 168 and gate electrode 146 in gate polysilicon 166. The enlarged plan view of FIG. 16 reveals that the topology of inter-poly dielectric 148 along vertical sidewalls of shield polysilicon 168 look similar to inter-poly dielectric 148 in the cross-sectional view of FIGS. 12-13.

Figure 17:
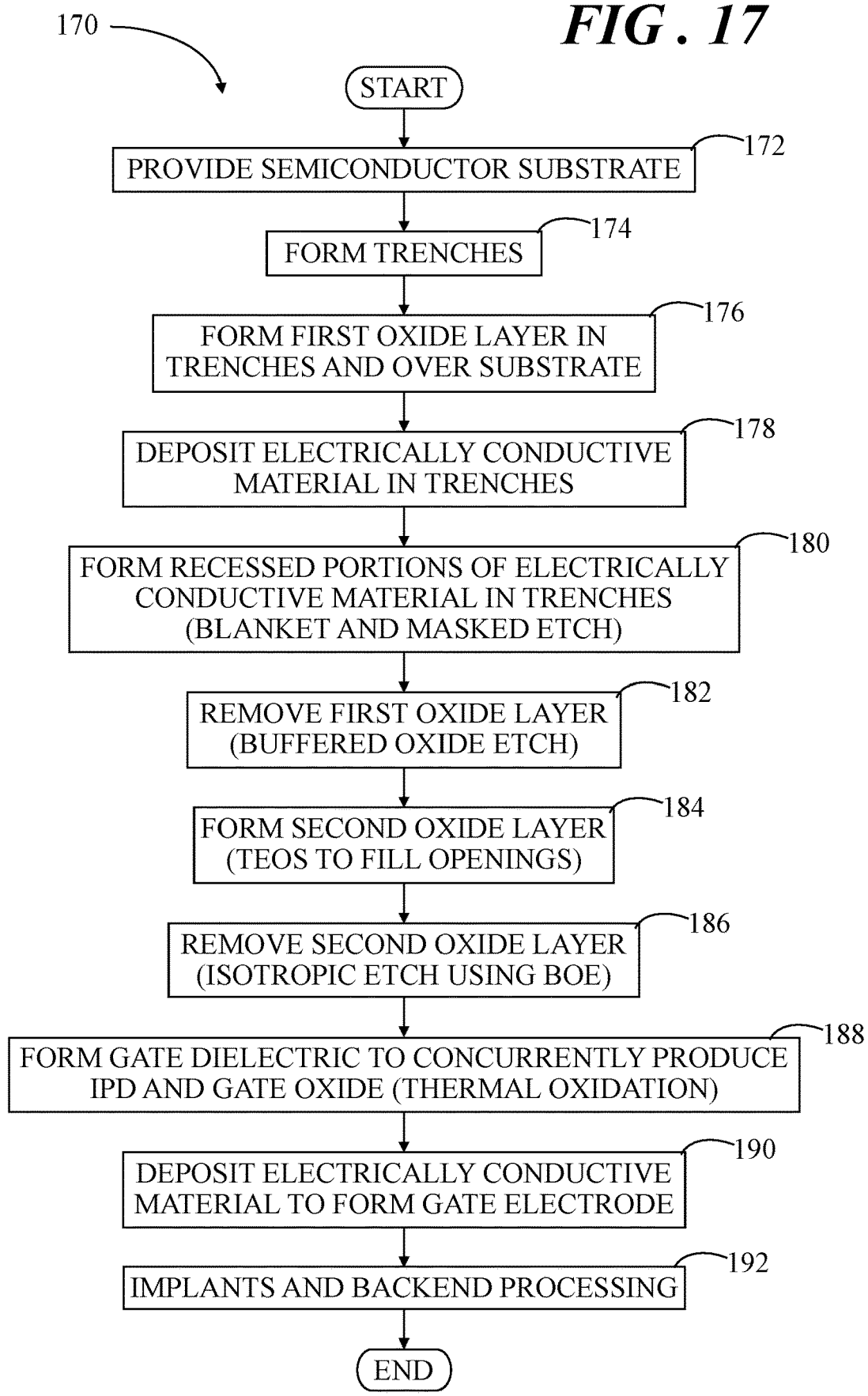
FIG. 17 shows a flowchart summarizing a method for manufacturing the super-junction power semiconductor device.

FIG. 17 shows a flowchart summarizing a method 170 for manufacturing a super-junction power semiconductor device. For simplicity, method 170 will be described in connection with power MOSFET 70 shown at various stages of manufacture in FIGS. 2-16. However, the following description applies equivalently to a super-junction power semiconductor device having a different configuration then that shown At a block 172, a semiconductor substrate (80) is provided having a semiconductor layer (82) (see FIG. 3). At a block 174, trenches (72, 74) are formed extending into the semiconductor layer (82) from the major surface (85) of the semiconductor layer (82) (see FIG. 4). At a block 176, a first oxide layer (98) is formed in the trenches (72, 74) and over the semiconductor layer (82) of the substrate (80) (see FIG. 5). At a block 178, electrically conductive material (108) is deposited in the trenches (72, 74) (see FIG. 6). At a block 180, recessed portions (114, 116) of the electrically conductive material (108) are formed in the trenches (72, 74) via for example a combination of a blanket and etched mask (see FIG. 7).

At a block 182, parts of the first oxide layer (98) are selectively removed using, for example, a buffered oxide etch (BOE) process, from sidewalls (102, 106) of the trenches (72, 74) and adjacent to shield sidewalls (130, 136) to produce first and second openings (132, 138) (see FIG. 8). At a block 184, a second oxide layer (140) is formed over and in contact with the shield electrodes (110, 112). The second oxide layer (140), which may be TEOS, is applied to a depth great enough to entirely fill the openings 132, 138 adjacent to the shield sidewalls (130, 136) in some embodiments (see FIG. 9). Thus, block 184 integrates oxide redeposition in to the process flow. At a block 186, parts of the second oxide layer (140) are removed using, for example, a BOE process, to expose top surfaces (128, 134) of the shield electrodes (110, 112) (see FIG. 10). Thus, block 186 integrates etch-back into the process flow.

At a block 188, gate dielectric (142) is formed over the top surfaces (128, 134) of the shield electrodes (110, 112) and on exposed sidewalls (102, 106) of the trenches (72, 74) by, for example, thermal oxidation (see FIG. 11). This gate dielectric (142) thus yields the inter-poly dielectric (148) and gate oxide (150) regions within the core trenches (74). At a block 190, additional electrically conductive material (144) is deposited over the gate dielectric (142) in the core trenches (74) to form gate electrodes (146) (see FIG. 12). At a block 192, implanting and backend processing are performed (see FIG. 13). Following block 192, method 170 for manufacturing a super-junction power MOSFET ends.

Accordingly, method 170 provides the operational blocks for forming a super-junction power MOSFET having an improved topography to thereby improve IPD voltage breakdown and decrease leakage relative to prior devices. It should be understood that certain ones of the process blocks depicted in FIG. 17 may be performed in parallel with each other or with performing other processes. In addition, the particular ordering of the process blocks depicted in FIG. 17 may be modified, while achieving substantially the same result. Accordingly, such modifications are intended to be included within the scope of the inventive subject matter.

Embodiments disclosed herein entail a super-junction power semiconductor device, such as a metal-oxide-semiconductor field effect transistor (MOSFET), and methodology for manufacturing the super-junction power MOSFET. More particularly, methodology integrates oxide redeposition and etch-back into process flow to yield an inter-poly dielectric layer (IPD) having an improved topography to thereby improve IPD voltage breakdown and decrease leakage relative to prior devices. Oxide redeposition and etch-back may be integrated into the process flow without requiring additional photolithography or other processes to cost effectively achieve improvements in the performance and long-term reliability of the super-junction power device.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for manufacturing a super-junction MOSFET comprising:
    forming a first trench in a semiconductor layer of a substrate;
    forming a first oxide layer over the semiconductor layer and in the first trench, wherein the first oxide layer is along a first bottom and first sidewalls of the first trench;
    depositing an electrically conductive material in the first trench to form a first shield electrode;
    removing a first portion of the electrically conductive material from the first trench, wherein a first part of the first oxide layer on the first sidewalls of the first trench is exposed from the electrically conductive material when the first portion of the electrically conductive material is removed;
    removing the first part of the first oxide layer from the first sidewalls of the first trench, the removing the first part of the first oxide layer additionally removing another part of the first oxide layer adjacent to first shield sidewalls of the first shield electrode to produce first openings along a first top part of the first shield sidewalls;
    forming a second oxide layer over and in contact with the first shield electrode, the second oxide layer filling the first openings, wherein the forming the second oxide layer comprises applying the second oxide layer to a depth great enough to entirely fill the first openings;
    removing a second part of the second oxide layer to expose a first top surface of the first shield electrode;
    forming a gate dielectric over the first top surface of the first shield electrode; and
    depositing additional electrically conductive material over the gate dielectric in the first trench to form a gate electrode of the MOSFET.

2. The method of claim 1 wherein:
the forming the second oxide layer further comprises forming the second oxide layer along the first sidewalls of the first trench;
the removing the second part of the second oxide layer further comprises removing the second oxide layer from the first sidewalls of the first trench to produce exposed first sidewalls; and
the forming the gate dielectric further comprises forming the gate dielectric on the exposed first sidewalls.

3. The method of claim 1 further comprising:
forming a second trench in the semiconductor layer of the substrate;
forming the first oxide layer along a second bottom and second sidewalls of the second trench;
depositing the electrically conductive material in the second trench to form a second shield electrode;
removing a second portion of the electrically conductive material from the second trench;
removing the first part of the first oxide layer in the second trench to produce second openings along a second top part of the second shield sidewalls of the second shield electrode;
forming the second oxide layer over and in contact with the second recessed portion of the second shield electrode, the second oxide layer filling the second openings;
removing the second part of the second oxide layer to expose a second top surface of the second shield electrode; and
forming the gate dielectric over the second top surface of the second shield electrode.

4. The method of claim 3 wherein:
the removing the first portion removes the electrically conductive material to a first depth in the first trench; and
the removing the second portion removes the electrically conductive material to a second depth in the second trench, the second depth being less than the first depth.

5. The method of claim 3 further comprising removing the gate dielectric from the second top surface of the second shield electrode following formation of the gate electrode.

6. The method of claim 1 wherein the gate electrode is vertically spaced from the first shield electrode such that the gate electrode does not lie lateral to the first shield sidewalls of the first shield electrode.

7. The method of claim 1 wherein the removing the second part of the second oxide layer includes isotropically etching the second oxide layer.

8. The method of claim 1 wherein the second oxide layer comprises tetraethyl orthosilicate (TEOS).

9. The method of claim 1 wherein the gate dielectric is formed by thermal oxidation.

10. The method of claim 1 wherein the electrically conductive material is first polysilicon material, the additional electrically conductive material is second polysilicon material, and the gate dielectric is an inter-poly dielectric.

11. A method of making a semiconductor device comprising:
forming a first mask over a semiconductor layer of a substrate, wherein the substrate includes a major surface, and a first trench and a second trench extend into the semiconductor layer from the major surface, each of the first and second trenches including a first dielectric layer along respective sidewalls and each of the first and second trenches being filled with a first polysilicon material, wherein the first mask is configured to cover the second trench;
removing a first portion of the first polysilicon material from the first trench;
removing the first mask;
removing a second portion of the first polysilicon material from the first and second trenches to produce a first shield electrode in the first trench and a second shield electrode in the second trench, wherein a first part of the first dielectric layer on the sidewalls of the first trench is exposed from the electrically conductive material following removal of the first and second portions of the electrically conductive material;
removing a first part of the first dielectric layer from the first and second trenches, wherein the removing the first part of the first dielectric layer removes the first dielectric layer from the sidewalls of the first trench, produces first openings along a first top part of the sidewalls of the first trench, and produces second openings along a second top part of the sidewalls of the second trench;
forming a second dielectric layer over and in contact with the first and second shield electrodes, wherein the forming the second dielectric layer comprises applying the second dielectric layer to a depth great enough to entirely fill the first and second openings;
removing a second part of the second dielectric layer to expose a first top surface of the first shield electrode, the first sidewalls of the first trench, and a second top surface of the second shield electrode;
forming a gate dielectric over the first and second top surfaces of the first and second shield electrodes and over the first sidewalls of the first trench; and
depositing a second polysilicon material in the first trench to form a gate electrode, wherein the gate dielectric remains between the first and second polysilicon materials in the first trench and the gate dielectric remains on the first sidewalls.

12. The method of claim 11 wherein:
the removing the first portion removes the electrically conductive material to a first depth in the first trench; and
the removing the second portion removes the electrically conductive material to a second depth in the second trench, the second depth being less than the first depth.

13. The method of claim 11 further comprising removing the gate dielectric from the second top surface of the second shield electrode following formation of the gate electrode.

14. The method of claim 11 wherein the removing the second part of the second dielectric layer includes isotropically etching the second dielectric layer.

15. The method of claim 11 wherein the second dielectric layer comprises tetraethyl orthosilicate (TEOS).

16. The method of claim 11 further comprising:
forming a doped implant region in a top portion of the semiconductor layer between the first and second trenches;
depositing a dielectric material over the substrate;
forming a first contact in the dielectric material over and in contact with the gate electrode; and
forming a second contact in the dielectric material over and in contact with the second shield electrode.

17. A method for manufacturing a super-junction MOSFET comprising:
forming a first trench in a semiconductor layer of a substrate;

forming a first oxide layer over the semiconductor layer and in the first trench, wherein the first oxide layer is along a first bottom and first sidewalls of the first trench;

depositing an electrically conductive material in the first trench to form a first shield electrode;

removing a first portion of the electrically conductive material from the first trench, wherein a first part of the first oxide layer on the first sidewalls of the first trench is exposed from the electrically conductive material when the first portion of the electrically conductive material is removed;

removing the first part of the first oxide layer from the first sidewalls of the first trench, the removing the first part of the first oxide layer additionally removing another part of the first oxide layer adjacent to first shield sidewalls of the first shield electrode to produce first openings along a first top part of the first shield sidewalls;

forming a second oxide layer over and in contact with the first recessed portion of the first shield electrode, wherein the second oxide layer is applied to a depth great enough to entirely fill the first openings and the second oxide layer is formed along the first sidewalls of the first trench;

removing a second part of the second oxide layer to expose a first top surface of the first shield electrode and to remove the second oxide layer from the first sidewalls of the trench to produce exposed sidewalls;

forming a gate dielectric over the first top surface of the first shield electrode and on the exposed first sidewalls; and depositing additional electrically conductive material over the gate dielectric in the first trench to form a gate electrode of the MOSFET.

18. The method of claim 17 further comprising:

forming a second trench in the semiconductor layer of the substrate;

forming the first oxide layer along a second bottom and second sidewalls of the second trench;

depositing the electrically conductive material in the second trench to form a second shield electrode;

removing a second portion of the electrically conductive material from the second trench;

removing the first part of the first oxide layer in the second trench to produce second openings along a second top part of the second shield sidewalls of the second shield electrode;

forming the second oxide layer over and in contact with the second recessed portion of the second shield electrode, the second oxide layer entirely filling the second openings;

removing the second part of the second oxide layer to expose a second top surface of the second shield electrode; and forming the gate dielectric over the second top surface of the second shield electrode.

19. The method of claim 18 further comprising removing the gate dielectric from the second top surface of the second shield electrode following formation of the gate electrode.

* * * * *